(12) United States Patent
Gao

(10) Patent No.: US 7,403,760 B1
(45) Date of Patent: Jul. 22, 2008

(54) DC OFFSET CORRECTION FOR DIRECT-CONVERSION RECEIVER

(75) Inventor: Weinan Gao, Littleton, MA (US)

(73) Assignee: Conexant Systems, Inc., Newport Beach, CA (US)

( * ) Notice: Subject to any disclaimer, the term of this patent is extended or adjusted under 35 U.S.C. 154(b) by 311 days.

(21) Appl. No.: 10/751,013

(22) Filed: Dec. 31, 2003

(51) Int. Cl.
*H04B 1/00* (2006.01)
(52) U.S. Cl. .............................. 455/312; 455/324
(58) Field of Classification Search ................ 455/296, 455/303, 307, 311, 312, 323, 324; 333/81 R
See application file for complete search history.

(56) References Cited

U.S. PATENT DOCUMENTS

| | | | |
|---|---|---|---|
| 4,679,243 A * | 7/1987 | McGeehan et al. ............. 455/47 |
| 5,867,777 A * | 2/1999 | Yamaji et al. ............. 455/234.1 |
| 6,324,231 B1 | 11/2001 | Huang | |
| 6,459,889 B1 * | 10/2002 | Ruelke ....................... 455/296 |
| 6,516,187 B1 | 2/2003 | Williams et al. | |
| 6,871,055 B2 * | 3/2005 | Hirano et al. ............... 455/310 |
| 7,043,206 B2 * | 5/2006 | Herdey et al. .............. 455/63.1 |
| 2002/0042256 A1 | 4/2002 | Baldwin et al. | |
| 2003/0128776 A1 | 7/2003 | Rawlins et al. | |
| 2005/0110550 A1 * | 5/2005 | Shi et al. ..................... 327/307 |

* cited by examiner

*Primary Examiner*—Nguyen Vo
(74) *Attorney, Agent, or Firm*—Jackson Walker L.L.P.; Christopher J. Rourk

(57) ABSTRACT

A DC offset correction system for a direct-conversion receiver is disclosed that may include a DC feedback correction servo-loop in signal communication with a baseband section, where the DC feedback correction servo-loop is coupled to both the input and output of the baseband section and an attenuator within the DC feedback correction servo-loop.

28 Claims, 7 Drawing Sheets

DC OFFSET CORRECTION FOR DIRECT-CONVERSION RECEIVER

BACKGROUND OF THE INVENTION

1. Field of the Invention

This invention relates generally to radio frequency ("RF") receivers and in particular to direct-conversion receivers with direct current ("DC") offset correction.

2. Related Art

In today's society, telecommunications systems are evolving at a rapid pace in response to the demands of society for more wireless communication systems, higher performance entertainment medium transmissions (via airwave, wired or satellite based) and broadband access whether wired or wireless. This evolution typically involves improving the performance of the communication system receivers or transceivers (i.e., which includes a receiver) while at the same time simplifying their manufacture.

Integrated circuit ("IC") technology has lead to numerous advances in receiver technology through both transistor scaling and layout by increasing the density of active circuits that may be integrated into a receiver. Additionally, there are numerous architectural approaches for designing the receivers. At present, the two most commonly utilized architectural approaches include superheterodyne receivers and direct-conversion receivers.

FIG. 1 shows a superheterodyne receiver 100, which is an architecture typically utilized in most telecommunication applications. It is therefore appreciated by those skilled in the art that superheterodyne receiver architectures are well known in the art. In FIG. 1, the superheterodyne receiver 100 may include a radio frequency ("RF") section 102, mixer 104, intermediate frequency ("IF") section 106, demodulator 108 and local oscillator ("LO") 110. In operation, an input signal 112 is first amplified by the RF section 102 and then mixed down to an IF frequency by mixer 104 utilizing a frequency reference 114 produced by the LO 110. The mixed output 116 is then filtered and potentially amplified by the IF section 106 and demodulated by demodulator 108 producing a baseband signal 118.

Direct-conversion receivers (also generally known as "homodyne" receivers) differ from superheterodyne receivers by eliminating the IF section 106 and are therefore typically known as "zero-frequency" receivers. A direct-conversion receiver operates by performing a direct conversion on a received RF signal producing a baseband signal. The direct-conversion receiver utilizes a mixer that mixes the received RF signal with a frequency signal produced by a LO operating at a frequency that is approximately equal to the RF frequency.

In FIG. 2, an example implementation of a direct-conversion receiver front-end 200 is shown. An input RF signal 202 is received by an amplifier 204 (such as a low-noise amplifier generally known as a "LNA"). The amplifier 204 amplifies the input RF signal 202 to produce an amplified signal 206 that is input into two mixers 208 and 210. The mixers 208 and 210 then mix the amplified signal 206 with a reference signal 212 and phase-shifted signal 214 produced by a local oscillator 216 and quadrature (i.e., 90 degrees) phase-shifter 218. The reference signal 212 has a frequency that is approximately centered at the channel frequency of the received input RF signal 202. A quadrature phase-shifter 218 produces the phase-shifted signal 214 by phase shifting the reference signal 212 by approximately 90 degrees.

The mixer 208 produces in-phase ("I-channel") output signal 220 and mixer 210 produces quadrature-phase ("Q-channel") output signal 222. The in-phase output signal 220 is then filtered with a low-pass filter ("LPF") 224 to produce the in-phase output signal 226. Similarly, the quadrature-phase output signal 222 is filtered with LPF 228 to produce the quadrature-phase output signal 230.

Unfortunately, direct-conversion receivers have a number of problems that include spurious LO leakage, distortion and direct current ("DC") offset. Of these problems, typically the DC offset is the most serious because the DC offset may appear in the middle of the down-converted signal spectrum and may be larger than the received signal itself. Additionally, the DC offset is typically larger than the thermal and flicker noise. The DC offset is unavoidable because it is caused by the transistor level amplifiers and filters due to mismatches in the signal path and spurious LO leakage.

Spurious LO leakage in a direct-conversion receiver is typically caused by the LO 216 being tuned to approximately the center frequency of the received RF signal 202. As a result, some LO energy may make its way back through the mixers 208 and 210 and amplifier 204, and travel out via the signal path of the received RF signal 202 (potentially an antenna or transmission line). This LO energy may then become an in-band interferer with other receivers (not shown) that are tuned to the same frequency.

If LO energy is reflected back from the signal path of the received RF signal 202 (as shown in reflected LO energy paths 232 and 234), the LO energy will again enter the mixers 208 and 210 and self-down-convert to produce DC output signals (not shown) at the output of the mixers 208 and 210 and input to the baseband section of the direct-conversion receiver. This LO leakage may result in a large DC offset because of self-mixing. The LO leakage may often be in the order of several tens of millivolts at the input of the baseband section. This may drive any active components within the baseband section out of their dynamic range causing distortion to the desired baseband signals. As a result, it is typically difficult to achieve high performance in integrated direct-conversion receivers because of the effects of the DC offset problem.

As an example, a typical high-performance satellite receiver may have a large gain in the range of approximately 40 to 70 decibels ("dB") within its baseband section. Such a large gain in the baseband typically amplifies any received DC offsets and intrinsic circuit DC offsets to a signal level that may saturate the baseband circuitry in the satellite receiver. The saturated circuitry may resultantly generate harmonics and inter-modulation tones that would unfortunately increase the implementation loss of the satellite receiver. Therefore, in order to improve the performance of direct-conversion receivers, there is a need for a system and method capable of correcting for the DC offset produced in direct-conversion receivers.

An attempted solution in the past included removing the DC offset by capacitive coupling (also known as alternating current "AC" coupling) the baseband An attempted solution in the past included removing the DC offset by capacitive coupling (also known as alternating current "AC" coupling) the baseband section of the direct-conversion receiver. This approach typically introduces AC coupling in the down-converted signal path to build a high-pass filtering section to block the DC offset and usually requires a large external capacitor to produce a low high-pass corner frequency for negligible signal loss. Unfortunately, large capacitors may lower the response time of the direct-conversion receiver. Additionally, large capacitors in a direct-conversion receiver would make implementing the direct-conversion receiver within a monolithic IC difficult because typically large capacitors consume correspondingly large areas of the IC.

The input impedance of the baseband section may determine the corner frequency but usually large variations of the input impedance may also make it difficult to control the value of the corner frequency. Furthermore, the DC offset in the baseband section, after AC coupling, is not eliminated and this typically limits the total allowable gain allocated to the analog baseband section. Additionally, multiple AC couplings in the baseband section may reduce the robustness of receiver system design.

An attempted solution to the problems associated with the AC coupling approach is shown in FIG. 3. In FIG. 3, a DC offset correction servo-loop 300 is shown with a negative feedback loop that loops around the baseband section 302 where the feedback loop may include a resistive and capacitive ("RC") integrator 304. The baseband section 302 may include a LPF 306 and a low-noise variable-gain amplifier 308 ("LN-VGA"). The integrator 304 may include an amplifier 310 (such as an operational amplifier "Op Amp") with a pair of capacitors (each of value "C") 312 and 314 and a pair of resistors (each of value "R") 316 and 318 configured as an integrator.

As an example of operation, if the baseband section 302 has a forward gain of $A_{ff}$, the resulting high-pass transfer function for the DC offset correction loop 300 would be defined by the following relationship:

$$\frac{V_o}{V_i} = A_{ff} \frac{s}{s + \frac{A_{ff}}{RC}},$$

where $V_i$ is the input voltage 320 of the baseband section 302, $V_o$ is the output voltage of the baseband section 302, and "s" is the well-known Laplace transform operator, which is equal to $\sigma + j\omega$. Additionally, the 3 dB high-pass corner frequency for the DC offset correction loop 300 would be defined by the following relationship:

$$f_{3db\_hp} = \frac{A_{ff}}{2\pi RC}.$$

Unfortunately, while this approach does help compensate for DC offset in a direct-conversion receiver in some situations, it does so by typically requiring higher resistor R and capacitor C values for low corner frequencies because of the effects of the forward gain $A_{ff}$. As a result, large external resistors and capacitors are usually required which in turn increases the overall direct-conversion receiver cost. Additionally, the DC offset resulting from the feedback path impairment typically will be amplified by the forward gain $A_{ff}$ to the point of potentially causing the feedback correction to fail.

Therefore, there is a need for a system and method that improves upon the performance of currently known direct-conversion receivers by correcting for DC offset.

SUMMARY

A DC offset correction system for a direct-conversion receiver is disclosed. The DC offset correction system may include a DC feedback correction servo-loop in signal communication with a baseband section, where the DC feedback correction servo-loop is coupled to both the input and output of the baseband section. The DC offset correction system may also include an attenuator within the DC feedback correction servo-loop. The attenuator is capable of generating an attenuation coefficient $k_{fb}$. The DC feedback correction servo-loop may also include an integrator circuit in signal communication with the output of the baseband section and a combiner circuit in signal communication with the input of the baseband section.

In an example operation, the DC offset correction system may perform a method that processes a received baseband output signal from the output of the baseband section to create a processed feedback signal, attenuates the processed feedback signal with an attenuation coefficient $k_{fb}$ to create an attenuated feedback signal, and transmits the attenuated feedback signal to the input of the baseband section.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

This invention discloses a direct-current ("DC") offset correction system (referred to herein as a "DC-offset Correction System") that corrects for the DC offset present in direct-conversion receivers. Generally, the DC-offset Correct System utilizes an improved DC feedback correction servo-loop that applies an attenuation coefficient in the feedback path.

Figure 1:
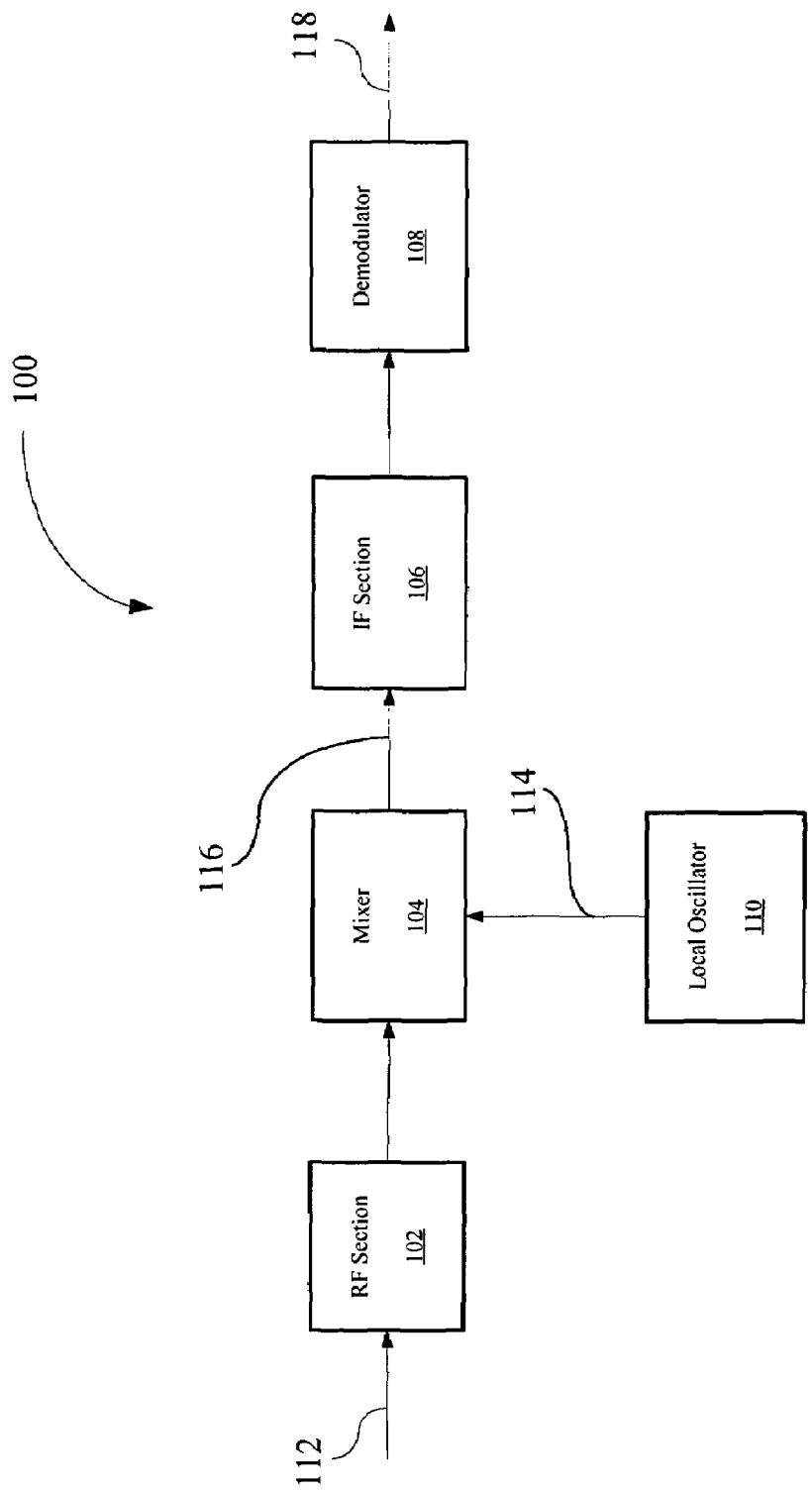
FIG. 1 is a block diagram of a prior art superheterodyne receiver.
Figure 2:
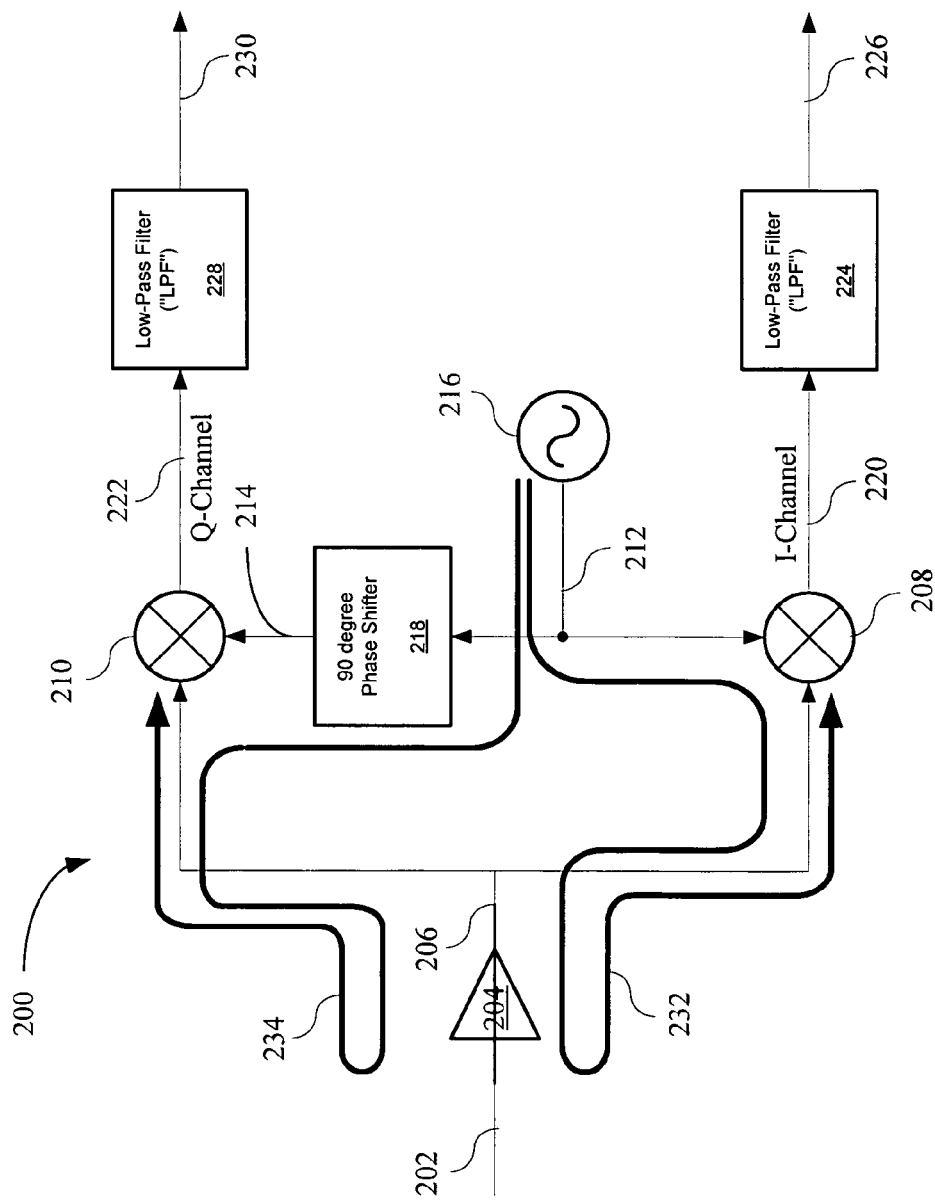
FIG. 2 is a block diagram of a prior art example implementation of a direct-conversion receiver front-end.
Figure 3:
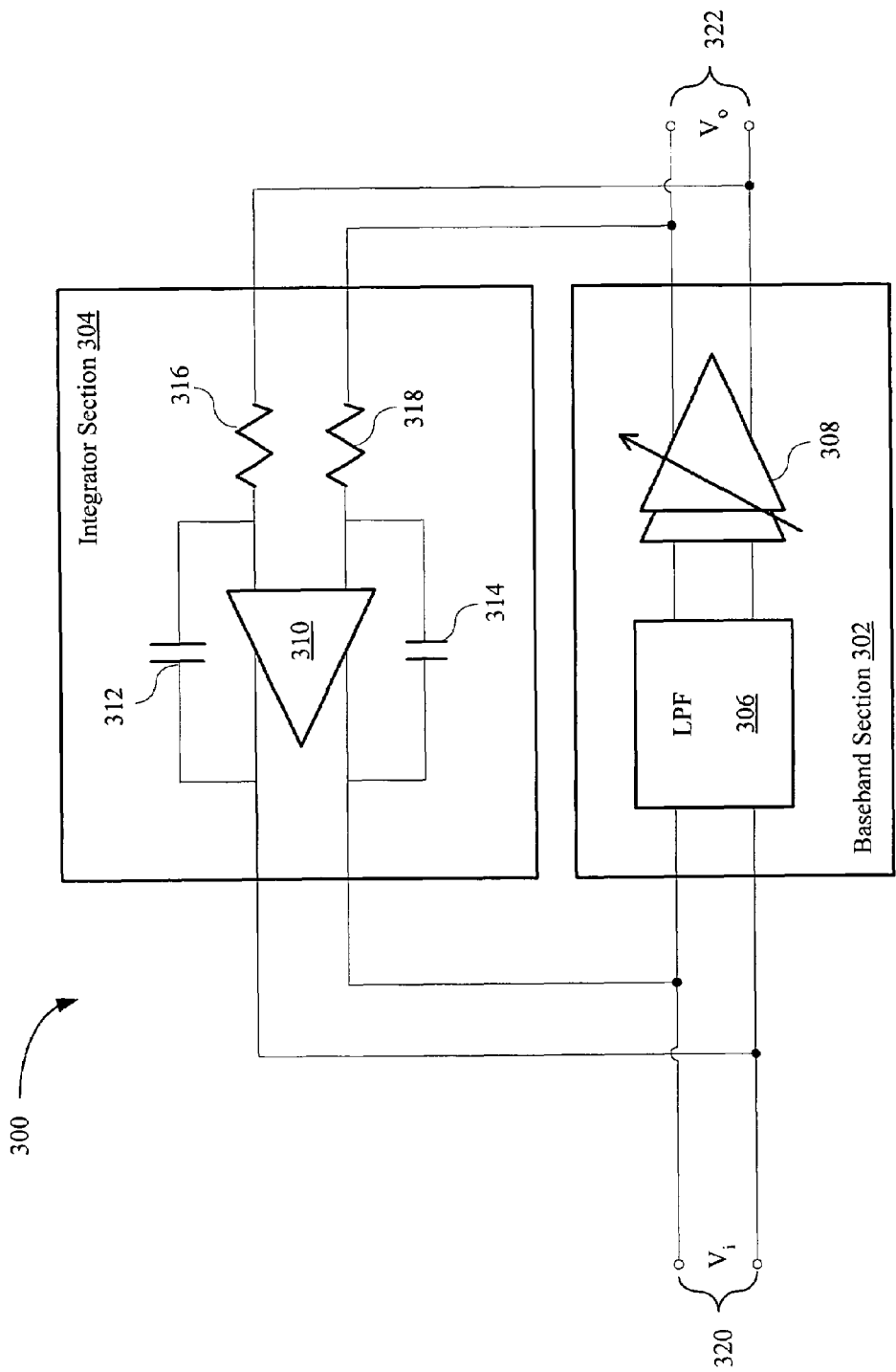
FIG. 3 is a block diagram of prior art example implementation of a direct-current ("DC") offset correction servo-loop for correcting for DC offset in the direct-conversion receiver front-end shown in FIG. 2.
Figure 4:
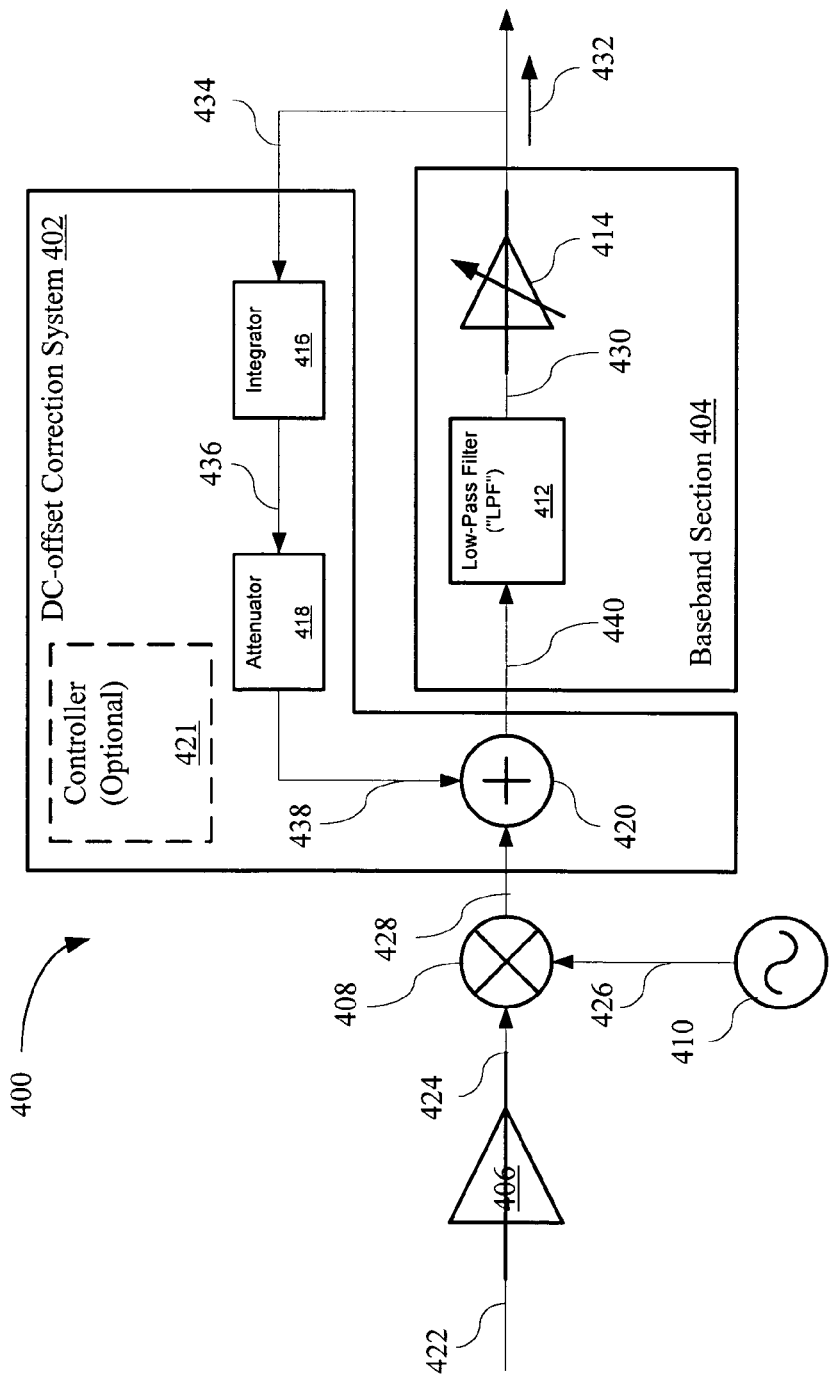
FIG. 4 is a block diagram of an example implementation of a direct-conversion receiver utilizing a DC-offset Correction System.

In FIG. 4, an example implementation of a direct-conversion receiver 400 utilizing a DC-offset Correction System 402 is shown. The direct-conversion receiver 400 may include the DC-offset Correction System 402 and a baseband section 404, LNA 406, mixer 408, and LO 410. The baseband section 404 may include a LPF 412 and VGA-LNA 414 and the DC-offset Correction System 402 may include an integrator 416, attenuator 418, combiner 420 and optional controller 421. The DC-offset Correction System 402 is a DC feedback correction servo-loop capable of producing an attenuation coefficient $k_{fb}$ within the DC feedback correction servo-loop with the attenuator 418.

It is appreciated by those skilled in the art that FIG. 4 is a top-level block diagram of the direct-conversion receiver 400 where the individual quadrature I and Q channel paths are not shown for simplicity purposes. However, it also appreciated that the LO 410 is capable of producing a quadrature frequency reference with the assistance of a quadrature phase-shifter (not shown) and that the mixer 408 is actually a pair of I and Q mixers producing I-channel and Q-channel outputs that are processed by both the baseband section 404 and DC-offset Correction System 402.

As an example of operation, the direct-conversion receiver 400 receives an input RF signal 422 from an input transmission line (not shown), which may be a strip-line, wire, coaxial cable, waveguide, fiber optic line (in the case of an optical signal) or other type of signal path from a receiving antenna. The input RE signal 422 is fed into the LNA 406, which amplifies the input RF signal 422 and produces an amplified RF signal 424 that is capable of driving the mixer 408. The mixer 408 then receives the amplified RF signal 424 and mixes it with a frequency reference signal 426 produced by the LO 410, where the frequency reference signal 426 has a frequency value that is approximately equal to the frequency of the input RF signal 422. The mixer 408 then produces a mixed output signal 428 that has been down-converted to approximately baseband and may include numerous frequency harmonics. The mixed output signal 428 is then passed through the combiner 420 to the LPF 412 in the baseband section 404. The LPF 412 removes the unwanted frequency harmonics and passes the filtered signal 430 to the LN-VGA 414. The LN-VGA 414 adjusts the gain of the filtered signal 430 and produces the demodulated output signal 432, which may be passed to other circuitry (not shown) or components (not shown) in the direct-conversion receiver.

The DC-offset Correction System 402 corrects for DC-offset by receiving a portion of the demodulated output signal 432 through a feedback signal path 434. The demodulated output signal 432 is fed back, via feedback signal path 434, to the integrator 416. The integrator 416 may be a RC type integrator that integrates the demodulated output signal 432 and produces a feedback signal 436 that is passed to the attenuator 418. The attenuator 418 then attenuates the feedback signal 436 and produces an attenuated signal 438 that is passed to the combiner 420. The combiner 420 then combines the attenuated signal 420 with the mixed output signal 428 and feeds the resulting combined signal 440 back into the LPF 412.

The optional controller 421 may determine the baseband section 404 gain $A_{ff}$, via a control path (not shown) such as a system communication bus, and adjust the attenuation coefficient $k_{fb}$, by sending control signals (not shown) to the attenuator 418, so that the attenuation coefficient $k_{fb}$ tracks the base baseband section 404 gain $A_{ff}$. The controller 421 may be implemented as a typical microcontroller, microprocessor, processor, application specific integrated circuit ("ASIC") and/or digital signal processor ("DSP").

Figure 5:
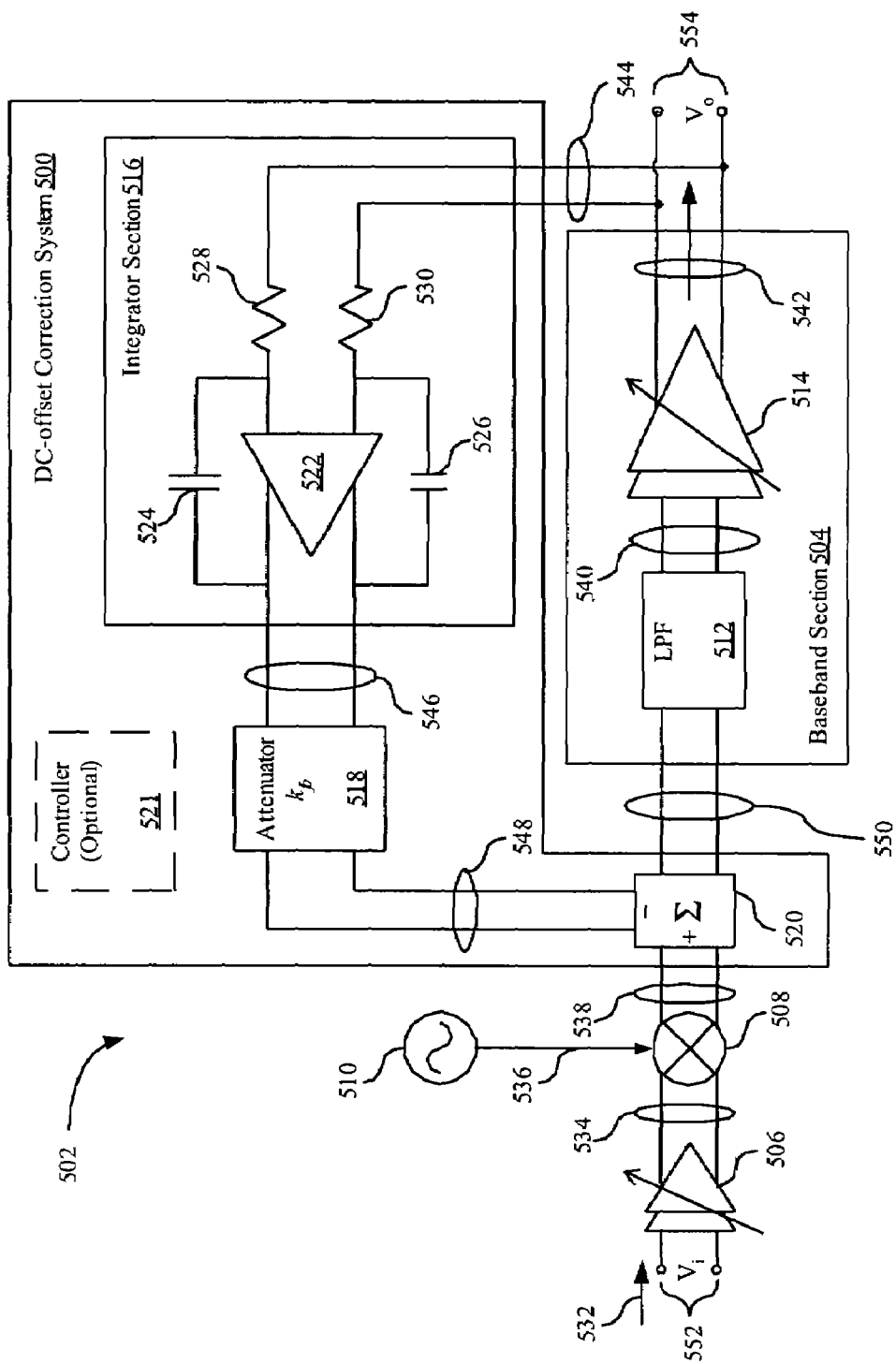
FIG. 5 is a block diagram of another example implementation of the DC-offset Correction System within the direct-conversion receiver shown in FIG. 4.

In FIG. 5, an example implementation of the DC-offset Correction System 500 within the direct-conversion receiver 502 is shown. The direct-conversion receiver 502 may include the DC-offset Correction System 500 and a baseband section 504, LN-VGA 506, a mixer 508, and LO 510. The baseband section 504 may include a LPF 512 and LN-VGA 514 and the DC-offset Correction System 500 may include an integrator 516, attenuator 518, combiner 520 and optional controller 521. The integrator 516 may include an amplifier 522 (such as an Op Amp) with a pair of capacitors (each of value "C") 524 and 526 and a pair of resistors (each of value "R") 528 and 530 configured as an integrator. The DC-offset Correction System 500 is a DC feedback correction servo-loop capable of producing an attenuation coefficient $k_{fb}$ within the DC feedback correction servo-loop with the attenuator 518.

As an example of operation, the direct-conversion receiver 502 receives an input RF signal 532 from an input transmission line (not shown), which may be a stripline, wire, coaxial cable, waveguide, fiber optic line (in the case of an optical signal) or other type of signal path from a receiving antenna. The input RF signal 532 is fed into the LN-VGA 506, which amplifies the input RF signal 532 and produces an amplified RF signal 534 that is capable of driving the mixer 508. The mixer 508 then receives the amplified RF signal 534 and mixes it with a frequency reference signal 536 produced by the LO 510, where the frequency reference signal 536 has a frequency value that is approximately equal to the frequency of the input RF signal 532. The mixer 508 then produces a mixed output signal 538 that has been down-converted to approximately baseband and that typically includes numerous frequency harmonics. The mixed output signal 538 is then passed through the combiner 520 to the LPF 512 in the baseband section 504. The LPF 512 removes the unwanted frequency harmonics and passes the filtered signal 540 to the LN-VGA 514. The LN-VGA 514 adjusts the gain of the filtered signal 540 and produces the demodulated output signal 542 that may be passed to other circuitry (not shown) or components (not shown) in the direct-conversion receiver.

The DC-offset Correction System 500 corrects for DC-offset by receiving a portion of the demodulated output signal 542 through a feedback signal path 544. The demodulated output signal 542 is fed back, via feedback signal path 544, to the integrator 516. The integrator 516 may be a RC type integrator that integrates the demodulated output signal 542 and produces a feedback signal 546 that is passed to the attenuator 518. The attenuator 418 then attenuates the feedback signal 546 producing an attenuated signal 548 that is passed to the combiner 520. The combiner 520 then combines the attenuated signal 548 with the mixed output signal 538 and feeds the resulting combined signal 550 back into the LPF 512. In this example, the combiner 520 subtracts the attenuated signal 548 from the mixed output signal 538.

Additionally, if the baseband section 504 has a forward gain of $A_{ff}$ and the attenuator has an attenuation coefficient of $k_{fb}$ (where the magnitude value of $k_{fb}$ is equal to or greater than 1) the resulting high-pass transfer function would be described by the relationship:

$$\frac{V_o}{V_i} = A_{ff} \frac{s}{s + \frac{A_{ff} k_{fb}}{RC}}$$

where $V_i$ is the input voltage 552 into the VGA-LNA 506, $V_o$ is the output voltage 554 of the baseband section 504, and "s" is the well-known Laplace transform operator, which is equal to $\sigma + j\omega$. Additionally, the 3 dB high-pass corner frequency for the DC offset Correction System 500 would be defined by the following relationship:

$$f_{3dB\_hp} = \frac{A_{ff} k_{fb}}{2\pi RC}.$$

From the transfer function relationship, it is appreciated that the attenuation coefficient $k_{fb}$ moves the transfer function high-pass pole, or the corner frequency, to a lower value. Therefore, a larger attenuation coefficient $k_{fb}$ results in smaller resistor R and capacitor C values for a desired corner frequency. As a result, the DC-offset Correction System 500 may be fully implemented on a single IC even when a low corner frequency is required such as, for example, in satellite broadcast communication systems that might require a corner frequency of approximately 4 kHz.

The attenuation coefficient $k_{fb}$ is also capable of attenuating the DC offset from the feedback integrator section 516 before the combiner 520. Therefore, the system can set the feedback coefficient $k_{fb}$ to reduce the DC offset from the feedback to a value that will not saturate the baseband section 504 elements (such as the LPF 512 and VGA-LNA 542) even if there is a large gain in the baseband section 504. As such, the feedback coefficient $k_{fb}$ allows for DC offset correction of a high-gain baseband section 504 with one servo-loop rather than several loops because the attenuation coefficient $k_{fb}$ compensates for large gain effects from the baseband section 504.

Furthermore, it is appreciated by those skilled in the art that the introduction of the attenuation coefficient $k_{fb}$ provides a general degree of freedom because the attenuation coefficient $k_{fb}$ may operate with the forward gain $A_{ff}$ in a way that maintains a small DC offset settling time for the DC offset servo-loop over a large range of forward baseband gain $A_{ff}$ values through digital coding which may be generated, for example, from a VAGC generation circuit (not shown).

Figure 6:
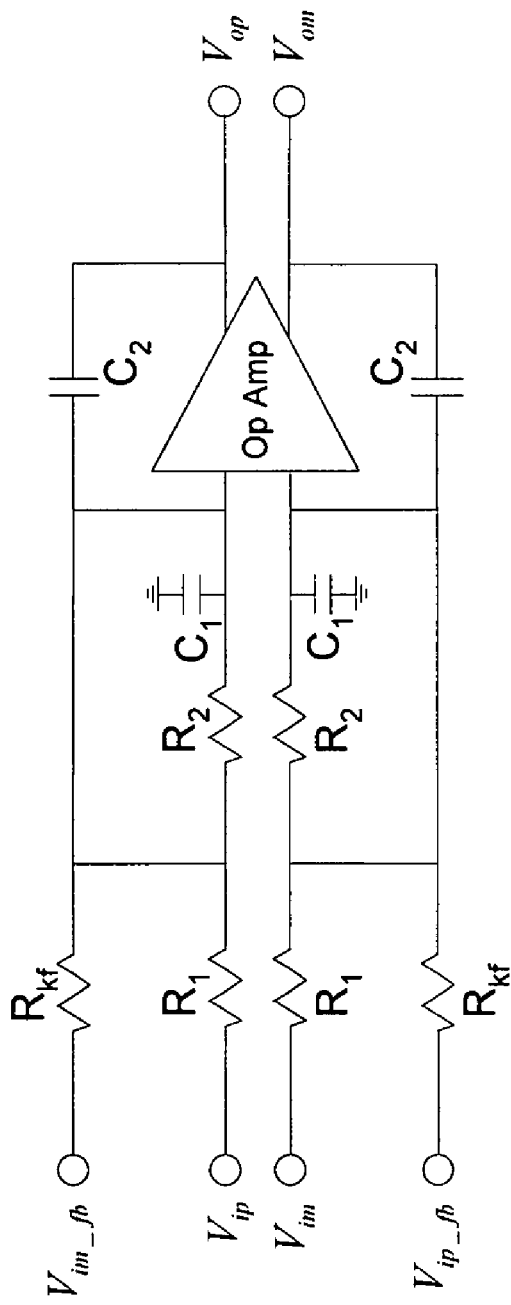
FIG. 6 is a block diagram of an example implementation of the attenuator shown in FIG. 4 and FIG. 5.

As an example, the attenuation coefficient $k_{fb}$ may be implemented utilizing a resistor for a summation with a Sallen-Key RC filter where the attenuation coefficient $k_{fb}$ may be implemented by the ratio of the feedback resistor over the resistor in the input path as shown in FIG. 6.

Furthermore, the DC-offset Correction System 500 may also be implemented utilizing a continuous-time open-loop integrator instead of the RC integrator 516. An example of non-RC continuous-time open-loop integrator may include a GmC and/or MOSFET-C integrator. Therefore, the DC-offset Correction System 500 may be utilized for a number applications including DC offset correction of individual blocks. For an example of a MOSFET-C integrator, see U.S. Pat. No. 6,313,687, issued on Nov. 6, 2001 to Mihai Banui, and titled "Variable impedance circuit," which is herein incorporated by reference in its entirety.

Unlike AC coupling, in operation, the DC-offset Correction System 500 does not block the signal in the baseband section 504 and thus creates a high-pass operation through feedback. The DC-offset Correction System 500 provides a correction for any offsets generated by the sub-sections (including the LPF 512 and VGA-LNA 514) in the baseband section 504 (i.e., the forward path of the servo-loop of the DC-offset Correction System 500), which cannot be done by AC coupling before the baseband section 504. As a result, the DC-offset Correction System 500 has a small residue DC offset left at the input of each sub-section of the baseband section 504 inside of the servo-loop in the forward path. Therefore, any clip level requirements of these sub-sections are more relaxed with the DC-offset Correction System 500.

Without the attenuation coefficient $k_{fb}$ produced by the attenuator 518 of the DC-offset Correction System 500, a conventional servo-loop approach would require a large capacitor and resistor to reduce the high-pass corner frequency for typical baseband section having large gain. Typically this would increase the cost of the overall receiver system because a non-DC-offset Correction System approach would usually require off-chip resistors and/or capacitors that would result in extra pins on the IC.

Therefore, the DC-offset Correction System 500 allows for monolithic IC implementation of the direct-conversion receiver 502 with a high gain baseband section 504 because of the attenuation coefficient $k_{fb}$ produced by the attenuator 518. As such, the DC-offset Correction System 500 does not require multiple DC offset servo-loops embedded within the baseband section 504. Moreover, the attenuation coefficient $k_{fb}$ can be adjusted to track the baseband section 504 gain $A_{ff}$ in order to maintain a small DC offset settling time and a relative constant corner frequency. The optional controller 521 may determine the baseband section 504 gain $A_{ff}$ via a control path (not shown) such as a system communication bus, and adjust the attenuation coefficient $k_{fb}$, by sending control signals (not shown) to the attenuator 518, so that the attenuation coefficient $k_{fb}$ tracks the base baseband section 504 gain $A_{ff}$. The controller 521 may be implemented as a typical microcontroller, microprocessor, processor, application specific integrated circuit ("ASIC") and/or digital signal processor ("DSP").

Figure 7:
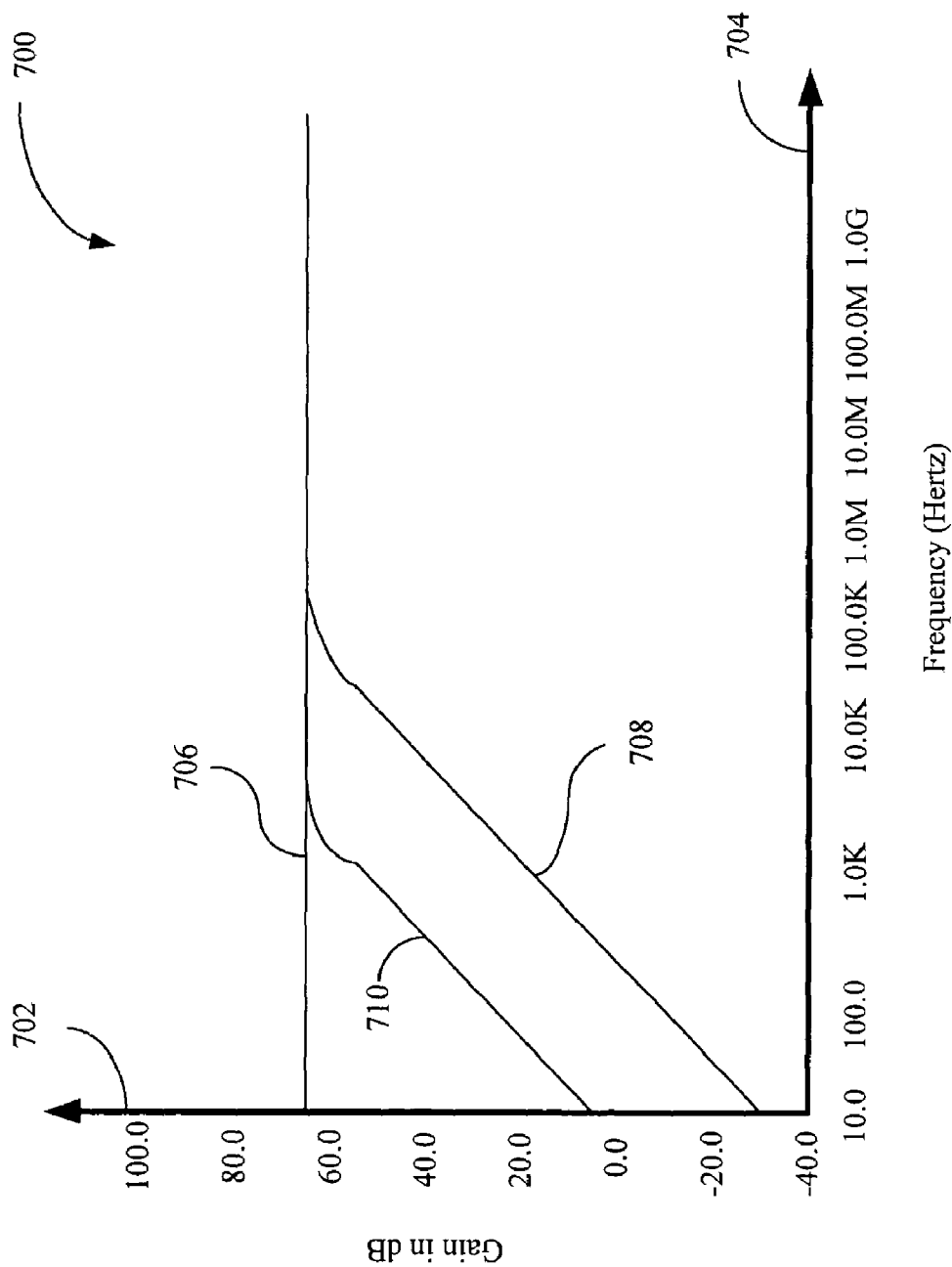
FIG. 7 is a plot showing the overall frequency response for the DC-offset Correction System shown in FIG. 5.

FIG. 7 is a plot 700 showing the overall frequency response for the DC-offset Correction System 500 shown in FIG. 5. The plot 700 shows the gain 702 of direct-conversion receiver 502 in dB versus logarithmic frequency 704 in Hertz ("Hz"). The first trace 706 is the gain of the system without the an offset servo loop, the second trace 708 shows the gain of the system with an offset servo loop, and the third trace 710 shows the gain of the system with attenuation coefficient $k_{fb}$ provided by the attenuator 518.

The processes described in FIGS. 4, 5, and 6 may be performed by hardware or software. If the process is performed by software, the software may reside in software memory (not shown) in the controller 521 and/or some a removable memory medium (not shown). The software in memory may include an ordered listing of executable instructions for implementing logical functions (i.e., "logic" that may be implemented either in digital form such as digital circuitry or source code or in analog form such as analog circuitry or an analog source such as an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples, i.e., "a non-exhaustive list" of the computer-readable medium, would include the following: an electrical connection ("electronic") having one or more wires, a portable computer diskette (magnetic), a RAM (electronic), a read-only memory ("ROM") (electronic), an erasable programmable read-only memory ("EPROM" or Flash memory) (electronic), an optical fiber (optical), and a portable compact disc read-only memory ("CDROM") (optical). Note that the computer-readable medium may even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

While various embodiments of the application have been described, it will be apparent to those of ordinary skill in the art that many more embodiments and implementations are possible that are within the scope of this invention. Accordingly, the invention is not to be restricted except in light of the attached claims and their equivalents. The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A DC offset correction system for a direct-conversion receiver that includes a baseband section that has an input and an output, the DC offset correction system comprising:
   a DC feedback correction servo-loop in signal communication with the baseband section, wherein the DC feedback correction servo-loop is coupled to both the input and output of the baseband section; and
   an attenuator within the DC feedback correction servo-loop capable of generating an attenuation coefficient $k_{fb}$.

2. The DC offset correction system of claim 1, wherein the DC feedback correction servo-loop includes:
   an integrator circuit in signal communication with the output of the baseband section; and
   a combiner circuit in signal communication with the input of the baseband section.

3. The DC offset correction system of claim 2, wherein the attenuator includes a resistor and a Sallen-Key RC filter.

4. The DC offset correction system of claim 2, wherein the integrator circuit is a RC filter.

5. The DC offset correction system of claim 2, wherein the integrator circuit is a non-RC filter.

6. The DC offset correction system of claim 2, further including a controller in signal communication with the baseband section and the attenuator.

7. The DC offset correction system of claim 6, wherein the controller generates a control signal that adjusts the attenuation coefficient $k_{fb}$.

8. The DC offset correction system of claim 6, wherein the controller generates a control signal that enables the attenuation coefficient $k_{fb}$ to track the gain of the baseband section.

9. The DC offset correction system of claim 2, wherein the DC feedback correction servo-loop is arranged to operate according to a high-pass transfer function as follows:

$$\frac{V_o}{V_i} = A_{ff} \frac{s}{s + \frac{A_{ff}k_{fb}}{RC}},$$

where $V_i$ is an input voltage into the system, $V_o$ is an output voltage of the baseband section, s is a Laplace transform operator, $A_{ff}$ is the forward gain of the baseband section, R is a resistance of the integrator circuit, and C is a capacitance of the integrator circuit.

10. The DC offset correction system of claim 1, wherein the attenuator includes a resistor and a Sallen-Key RC filter.

11. The DC offset correction system of claim 10, further including a controller in signal communication with the baseband section and the attenuator.

12. The DC offset correction system of claim 1, further including a controller in signal communication with the baseband section and the attenuator.

13. A DC offset correction system for a direct-conversion receiver that includes a baseband section that has an input and an output, the DC offset correction system comprising:
   a DC feedback correction servo-loop in signal communication with the baseband section, wherein the DC feedback correction servo-loop is coupled to both the input and output of the baseband section; and
   means for producing an attenuation coefficient $k_{fb}$ within the DC feedback correction servo-loop, the attenuation means in signal communication with the input of the baseband section.

14. The DC offset correction system of claim 13, wherein the DC feedback correction servo-loop includes:
   a means for integrating a received signal from the output of the baseband section; and
   a means for combining an attenuated feedback signal produced by the attenuation means with received signals to the input of the baseband section.

15. The DC offset correction system of claim 14, wherein the attenuator means includes a resistor and a Sallen-Key RC filter.

16. The DC offset correction system of claim 14, wherein the means for integrating includes a RC filter.

17. The DC offset correction system of claim 14, wherein the means for integrating includes a non-RC filter.

18. The DC offset correction system of claim 14, further including a controller in signal communication with the baseband section and the attenuator means.

19. The DC offset correction system of claim 18, wherein the controller generates a control signal that adjusts the attenuation coefficient $k_{fb}$.

20. The DC offset correction system of claim 18, wherein the controller generates a control signal that enables the attenuation coefficient $k_{fb}$ to track the gain of the baseband section.

21. The DC offset correction system of claim 14, wherein the DC feedback correction servo-loop is arranged to operate according to a high-pass transfer function as follows:

$$\frac{V_o}{V_i} = A_{ff} \frac{s}{s + \frac{A_{ff}k_{fb}}{RC}},$$

where $V_i$ is an input voltage into the system, $V_o$ is an output voltage of the baseband section, s is a Laplace transform operator, $A_{ff}$ is the forward gain of the baseband section, R is a resistance of the integrator means, and C is a capacitance of the integrator means.

22. A method for correcting for DC offset in a direct-conversion receiver that includes a baseband section that has an input and an output utilizing a DC offset correction system, the method comprising:
   processing a received baseband output signal from the output of the baseband section to create a processed feedback signal;
   attenuating the processed feedback signal with an attenuation coefficient $k_{fb}$ to create an attenuated feedback signal;
   transmitting the attenuated feedback signal to the input of the baseband section.

23. The method of claim 22, wherein processing includes integrating the received baseband output signal with an integrator circuit.

24. The method of claim 23, wherein the feedback signal is processed in a DC feedback correction servo-loop of the DC offset correction system that is coupled to an input and an output of the baseband section, integrating includes operating an integrator circuit of the DC offset correction system, and the method further includes operating the DC feedback correction servo-loop according to a high-pass transfer function as follows:

$$\frac{V_o}{V_i} = A_{ff} \frac{s}{s + \frac{A_{ff}k_{fb}}{RC}},$$

where $V_i$ is an input voltage into the system, $V_o$ is an output voltage of the baseband section, s is a Laplace transform operator, $A_{ff}$ is the forward gain of the baseband section, R is a resistance of the integrator circuit, and C is a capacitance of the integrator circuit.

25. The method of claim 22, wherein attenuating includes generating the attenuation coefficient $k_{fb}$ utilizing a resistor for a summation with a Sallen-Key RC filter.

26. The method of claim 25, wherein the attenuation coefficient $k_{fb}$ is implemented by the ratio of a feedback resistor over the resistor in the input path as Sallen-Key RC filter.

27. The method of claim 22, wherein transmitting includes combining the attenuated feedback signal with an input signal that is being input into the baseband section.

28. The method of claim 22, further including controlling the attenuating wherein the attenuation coefficient $k_{fb}$ tracks the gain of the baseband section.

* * * * *